US009754644B2

(12) United States Patent
Wang et al.

(10) Patent No.: US 9,754,644 B2
(45) Date of Patent: Sep. 5, 2017

(54) EXTENSIBLE CONFIGURABLE FPGA STORAGE STRUCTURE AND FPGA DEVICE

(71) Applicant: CAPITAL MICROELECTRONICS CO., LTD., Beijing (CN)

(72) Inventors: Yuanpeng Wang, Beijing (CN); Ping Fan, Beijing (CN); Jia Geng, Beijing (CN)

(73) Assignee: CAPITAL MICROELECTRONICS CO., LTD., Beijing (CN)

(*) Notice: Subject to any disclaimer, the term of this patent is extended or adjusted under 35 U.S.C. 154(b) by 0 days.

(21) Appl. No.: 14/758,357

(22) PCT Filed: Dec. 30, 2014

(86) PCT No.: PCT/CN2014/095661
§ 371 (c)(1),
(2) Date: Jun. 29, 2015

(87) PCT Pub. No.: WO2016/106601
PCT Pub. Date: Jul. 7, 2016

(65) Prior Publication Data
US 2016/0322084 A1  Nov. 3, 2016

(51) Int. Cl.
| | |
|---|---|
| *G11C 7/10* | (2006.01) |
| *G11C 7/22* | (2006.01) |
| *G11C 8/10* | (2006.01) |
| *G11C 8/18* | (2006.01) |
| *G11C 8/06* | (2006.01) |

(52) U.S. Cl.
CPC ............ *G11C 7/109* (2013.01); *G11C 7/1051* (2013.01); *G11C 7/22* (2013.01); *G11C 8/06* (2013.01); *G11C 8/10* (2013.01); *G11C 8/18* (2013.01)

(58) Field of Classification Search
CPC ......... G11C 7/109; G11C 7/1051; G11C 7/10; G11C 7/20; G11C 8/10; G11C 8/18; G11C 8/06
USPC ............ 365/189.02, 189.03, 189.05, 230.06, 365/230.08, 191; 326/37–41
See application file for complete search history.

(56) References Cited

U.S. PATENT DOCUMENTS

| | | | | |
|---|---|---|---|---|
| 6,834,014 | B2* | 12/2004 | Yoo | ........................ G11C 7/10 365/148 |
| 7,068,070 | B2* | 6/2006 | Or-Bach | ............. G06F 17/5054 326/38 |

(Continued)

*Primary Examiner* — Gene Auduong
(74) *Attorney, Agent, or Firm* — Buchanan Ingersoll & Rooney PC

(57) ABSTRACT

An extensible configurable FPGA storage structure and an FPGA device, where the FPGA storage structure includes: a plurality of local storage units, a controller and two clock buffers, where the two clock buffers are separately used for providing different clock signals for two clock input ports of the controller; the controller is used for receiving a write address signal input externally, and driven by the clock signals, generating a plurality of enable signals and write address decoding signals to be output to the plurality of local storage units; and each of the local storage units includes a local memory and a multiplexer used for providing input data for the local memory; and, based on a configuration mode of each local storage unit, generates output data in the corresponding configuration mode according to the enable signals, input write address decoding signals or read address signals, and the input data.

13 Claims, 2 Drawing Sheets

(56) References Cited

U.S. PATENT DOCUMENTS

| | | | | |
|---|---|---|---|---|
| 7,102,958 B2* | 9/2006 | Lee | ............ | G11C 5/00 |
| | | | | 365/189.12 |
| 7,277,356 B2* | 10/2007 | Lee | ............ | G11C 5/00 |
| | | | | 365/230.03 |
| 7,457,189 B2* | 11/2008 | Lee | ............ | G11C 5/00 |
| | | | | 365/189.03 |
| 7,636,273 B2* | 12/2009 | Lee | ............ | G11C 5/00 |
| | | | | 365/230.06 |
| 7,804,720 B2* | 9/2010 | Lee | ............ | G11C 5/00 |
| | | | | 365/189.03 |
| 9,092,873 B2* | 7/2015 | Dutton | ......... | G06T 1/20 |
| 9,142,002 B2* | 9/2015 | Dutton | ......... | G06T 1/20 |
| 9,298,618 B1* | 3/2016 | Wentzlaff | ......... | G06F 12/0813 |
| 2005/0007835 A1* | 1/2005 | Lee | ............ | G11C 5/00 |
| | | | | 365/189.12 |
| 2006/0176075 A1* | 8/2006 | Or-Bach | ......... | G06F 17/5054 |
| | | | | 326/38 |
| 2006/0262611 A1* | 11/2006 | Lee | ............ | G11C 5/00 |
| | | | | 365/189.12 |
| 2007/0291575 A1* | 12/2007 | Lee | ............ | G11C 5/00 |
| | | | | 365/230.06 |
| 2009/0059680 A1* | 3/2009 | Lee | ............ | G11C 5/00 |
| | | | | 365/189.03 |
| 2010/0054053 A1* | 3/2010 | Lee | ............ | G11C 5/00 |
| | | | | 365/189.011 |

* cited by examiner

EXTENSIBLE CONFIGURABLE FPGA STORAGE STRUCTURE AND FPGA DEVICE

BACKGROUND

Technical Field

The present invention relates to the field of integrated circuit technologies, and in particular, to an extensible configurable FPGA storage structure and an FPGA device.

Related Art

A Field-Programmable Gate Array (FPGA) is a logic device that has abundant hardware resources, a powerful parallel processing capability and a flexible reconfigurable capability. With these features, the FPGA is increasingly widely used in many fields such as data processing, communications and networks.

A local memory is an extremely important on-chip resource type of the FPGA. Design of a local memory architecture is directly related to scalability and flexibility of logic performance and storage performance of the FPGA. In an FPGA architecture, there are mainly two types of structures that provide a data storage function: registers and block memories. The registers are dispersed in the FPGA, and together with lookup tables (LUTs), constitute basic units of the FPGA architecture, i.e., programmable logic blocks (PLBs). Each register has its own clock, enable, reset and data input/output ports. The block memories, as FPGA-centralized data storage units, have a relatively large capacity (usually a dozen Kb to dozens of Kb), and the capacity of the block memory is fixed, so that large-scale storage structure design can be achieved.

Based on the existing local memory architecture, when it is necessary to achieve small-capacity (e.g., a few Kb) memory design, if the design is implemented by using registers, it is necessary to additionally consume a large number of lookup tables to achieve address write/read control logic; and if the design is implemented by using block memories, additional consumption is unnecessary, but it will cause a waste of storage resources.

SUMMARY

The present invention provides an extensible configurable FPGA storage structure and an FPGA device, wherein the storage structure is used to achieve design of medium-capacity memories, which can avoid additional consumption of logic resources and also avoid a waste of storage resources brought by use of block memories.

In a first aspect, an embodiment of the present invention provides an extensible configurable FPGA storage structure, including:

a plurality of local storage units, a controller and two clock buffers, where the two clock buffers are separately used for providing different clock signals for two clock input ports of the controller;

the controller is used for receiving a write address signal input externally, and driven by the clock signals, generating a plurality of enable signals and write address decoding signals to be output to the plurality of local storage units; and each of the local storage units includes a local memory and a multiplexer used for providing input data for the local memory; and, based on a configuration mode of each local storage unit, generates output data in the corresponding configuration mode according to the enable signals, input write address decoding signals or read address signals, and the input data.

Preferably, the local memory includes:

a data input port, a read address input port, a write address input port, an enable signal input port, a first output port, a second output port, and a shift data output port.

Further preferably, the configuration mode includes:

a six-input lookup table LUT6 mode, a double five-input lookup table LUT5_2 mode, a 64-bit local memory LRAM64×1 mode, a double 32-bit local memory LRAM32×2 mode, a 32-bit shift register SR32×1 mode, and a double 16-bit shift register SR16×2 mode.

Further preferably, the multiplexer is specifically a 3-to-1 multiplexer, where when the configuration mode is the LRAM64×1 mode, the multiplexer is used for outputting the input data to the data input port;

when the configuration mode is the LRAM32×2 mode, the multiplexer is used for outputting input data of a low LRAM32 in two LRAM32 to the data input port;

when the configuration mode is the SR32×1 mode, the multiplexer is used for outputting shift output data output by a shift data output port of an upper-level SR32 to the data input port; and when the configuration mode is the SR16×2 mode, the multiplexer is used for outputting, to the data input port, shift output data output by a shift data output port of a low SR16 in two upper-level SR16.

Further preferably, when the configuration mode is the LRAM64×1 mode, the data input port is used for receiving the input data;

the read address input port is used for receiving a 6-bit read address signal;

the write address input port includes a 5-bit low write address decoding input port and an 8-bit high write address decoding input port, separately used for receiving corresponding write address decoding signals;

the enable signal input port is used for receiving a write enable signal; and the second output port is used for outputting the output data.

Further preferably, when the configuration mode is the LRAM32×2 mode, the data input port is used for receiving input data of a low LRAM32 in two LRAM32;

in the read address input port, the highest bit is used for receiving input data of a high LRAM32 in the two LRAM32, and the other 5 bits are used for receiving a 5-bit read address signal;

the write address input port includes a 5-bit low write address decoding input port and an 8-bit high write address decoding input port, separately used for receiving corresponding write address decoding signals;

the enable signal input port is used for receiving a write enable signal;

the first output port is used for outputting output data of the high LRAM32 in the two LRAM32; and the second output port is used for outputting output data of the low LRAM32 in the two LRAM32.

Further preferably, when the configuration mode is the SR32×1 mode, the data input port is used for receiving shift input data;

in the read address input port, 5 bits except the highest bit are used for receiving a dynamic read address signal;

the enable signal input port is used for receiving a shift enable signal;

the second output port is used for outputting the output data; and the shift data output port is used for outputting shift output data.

Further preferably, when the configuration mode is the SR16×2 mode, the data input port is used for receiving shift input data of a low SR16 in two SR16;

in the read address input port, the highest bit is used for receiving shift input data of a high SR16 in the two SR16, and 5 bits except the highest bit are used for receiving a dynamic read address signal;

the enable signal input port is used for receiving a shift enable signal;

the first output port is used for outputting output data of the high SR16 in the two SR16;

the second output port is used for outputting output data of the low SR16 in the two SR16; and the shift data output port is used for outputting shift output data.

Further preferably, when the configuration mode is the LUT6 mode, the read address input port is used for receiving a 6-bit input signal; and the second output port is used for outputting output data of the LUT6.

Further preferably, when the configuration mode is the LUT5×2 mode, in the read address input port, 5 bits except the highest bit are used for receiving a 5-bit input signal;

the first output port is used for outputting output data of the first LUT5 in two LUT5; and the second output port is used for outputting output data of the second LUT5 in the two LUT5.

Preferably, the controller includes:

a first clock input port, a second clock input port, a low 6-bit write address input port, a low 7-bit write address input port, a low 8-bit write address input port, four write enable signal output ports, a first write address decoding signal output port and a second write address decoding signal output port, where in a 6-bit address signal input by the low 6-bit write address input port, 3 bits are decoded to obtain an 8-bit second write address decoding signal; two bits in the other 3 bits are decoded to obtain first 4 bits in a 5-bit first write address decoding signal; and the last bit in the other 3 bits directly serves as the last bit in the first write address decoding signal; and the number of the plurality of local storage units is specifically 4, and the four write enable signal output ports separately output enable signals to the 4 local storage units.

Further preferably, the storage structure further includes: an output selection unit, where the output selection unit comprises: seven 2-to-1 multiplexers, where an input end of a first 2-to-1 multiplexer is separately connected to a second output port of a fourth local memory and a second output port of a third local memory;

an input end of a second 2-to-1 multiplexer is separately connected to a second output port of a second local memory and a second output port of a first local memory;

an input end of a third 2-to-1 multiplexer is separately connected to output ends of the first 2-to-1 multiplexer and the second 2-to-1 multiplexer;

an input end of a fourth 2-to-1 multiplexer is separately connected to a first output port of the fourth local memory and the output end of the first 2-to-1 multiplexer, and multiplexes and outputs a fourth multiplexing output signal of the storage structure;

an input end of a fifth 2-to-1 multiplexer is separately connected to a first output port of the second local memory and the output end of the second 2-to-1 multiplexer, and multiplexes and outputs a third multiplexing output signal of the storage structure;

an input end of a sixth 2-to-1 multiplexer is separately connected to a first output port of the third local memory and an output end of the third 2-to-1 multiplexer, and multiplexes and outputs a second multiplexing output signal of the storage structure; and an input end of a seventh 2-to-1 multiplexer is separately connected to a first output port of the first local memory and a shift data output port of the first local memory, and multiplexes and outputs a first multiplexing output signal of the storage structure.

In a second aspect, an embodiment of the present invention provides an FPGA device, where the FPGA device includes the extensible configurable FPGA storage structure in the first aspect.

The extensible configurable FPGA storage structure provided in the embodiment of the present invention uses a structure of repeated local storage units, simplifying the design; and based on a configuration mode for each local storage unit, inside the storage unit, the highest bit of a read address and the highest bit of input data are processed as sharing the same signal input port, so as to reduce the demands for interconnected resources in a case in which functions are unchanged. Accordingly, during implementation of the design of medium-capacity memories, additional consumption of logic resources can be avoided, and a waste of storage resources brought by use of block memories can also be avoided.

The technical solutions of the present invention are further described below in detail with reference to the accompanying drawings and embodiments.

DETAILED DESCRIPTION

To make the objectives, technical solutions, and advantages of the present invention clearer, the present invention is further described below in detail with reference to the accompanying drawings. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
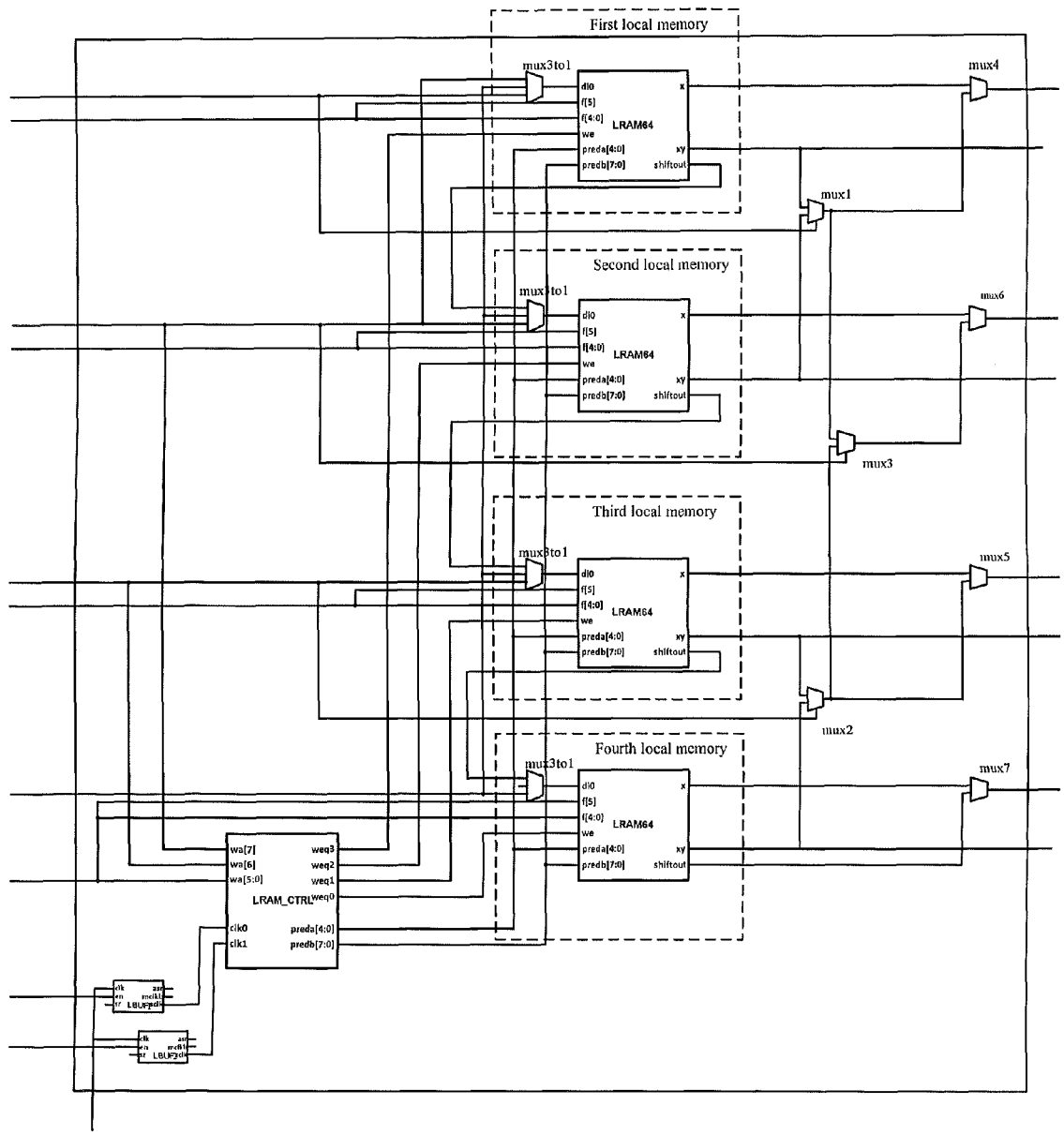
FIG. 1 is a schematic diagram of an extensible configurable FPGA storage structure according to an embodiment of the present invention.

FIG. 1 is a schematic diagram of an extensible configurable FPGA storage structure according to an embodiment of the present invention. As shown in FIG. 1, the storage structure includes: four local storage units, a controller (LRAM_CTRL) and two clock buffers (an LBUF1 and an LBUF2), where the LBUF1 and the LBUF2 are separately used for providing different clock signals for two clock input ports clk0 and clk1 of the LRAM_CTRL; and one of the clock signals is selected as a clock input by using enable signals en of the LBUF1 and the LBUF2;

the LRAM_CTRL is used for receiving a write address signal wa input externally, and driven by the clock signal clk0 or clk1, generating a plurality of enable signals weq0-weq3 and write address decoding signals preda and predb to be output to the four local storage units; and each of the local storage units includes a local memory (LRAM64) and a multiplexer (mux3to1) used for providing input data for the local memory; and, based on a configuration mode of each local storage unit, generates one or more of output data x, xy and shiftout in the corresponding configuration mode according to the enable signals we, input write address decoding signals preda and predb or read address signals f, and the input data di.

Figure 2:
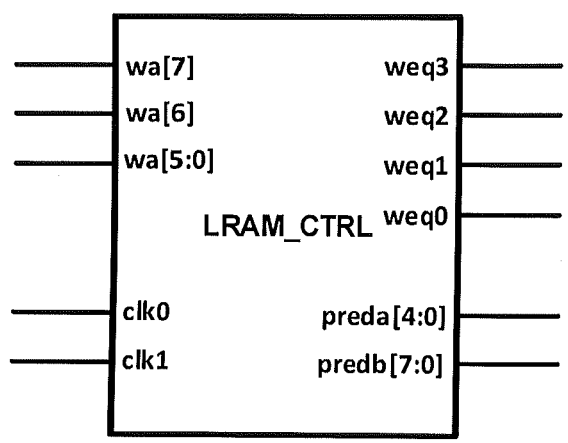
FIG. 2 is a schematic diagram of ports of a controller according to an embodiment of the present invention.

As shown in FIG. 2, the controller LRAM_CTRL specifically includes: a first clock input port clk0, a second clock input port clk1, a low 6-bit write address input port wa[5:0], a $7^{th}$ bit write address input port wa[6], a 8th bit write address input port wa[7], four write enable signal output ports weq0, weq1, weq2 and weq3, a first write address decoding signal output port preda[4:0], and a second write address decoding signal output port predb[7:0], where in a 6-bit address signal input by the low 6-bit write address input port wa[5:0], 3 bits are decoded to obtain an 8-bit ($2^3$=8) second write address decoding signal predb[7:0]; two bits in the other 3 bits are decoded to obtain first 4 bits ($2^2$=4) in a 5-bit first write address decoding signal; and the last bit in the other 3 bits directly serves as the last bit in the first write address decoding signal, so as to obtain the first write address decoding signal preda[4:0]; and according to 2-bit address signals input by high 2-bit write address input ports wa[6] and wa[7] and a configuration signal we_mode[1:0] of the LRAM_CTRL (we_mode is a configuration signal, used for pre-configuring the LRAM_C-TRL), to obtain weq0, weq1, weq2 and weq3 output by four valid or invalid write enable signal output ports. The four local storage units determine the working mode as write or read according to enable signals separately output by the four write enable signal output ports weq0, weq1, weq2 and weq3.

In a specific implementation manner, the logical relationship may be shown in Table 1 below:

TABLE 1

| we_mode[1:0] | wa[7:6] | weq[3] | weq[2] | weq[1] | weq[0] |
|---|---|---|---|---|---|
| 00 | xx | 1 | 1 | 1 | 1 |
| 01 | x0 | 0 | 1 | 0 | 1 |
| 01 | x1 | 1 | 0 | 1 | 0 |
| 10 | 0x | 0 | 0 | 1 | 1 |
| 10 | 1x | 1 | 1 | 0 | 0 |

TABLE 1-continued

| we_mode[1:0] | wa[7:6] | weq[3] | weq[2] | weq[1] | weq[0] |
|---|---|---|---|---|---|
| 11 | 00 | 0 | 0 | 0 | 1 |
| 11 | 01 | 0 | 0 | 1 | 0 |
| 11 | 10 | 0 | 1 | 0 | 0 |
| 11 | 11 | 1 | 0 | 0 | 0 |

The above discusses the controller part, and the local storage units are described below.

The configuration mode of each local storage unit may be one of the following configuration modes: a six-input lookup table LUT6 mode, a double five-input lookup (shared five-input two-output lookup table) table LUT5_2 mode, a 64-bit local memory LRAM64×1 mode, a double 32-bit local memory LRAM32×2 mode, a 32-bit shift register SR32×1 mode, and a double 16-bit shift register SR16×2 mode.

The mux3to1 outputs different types of data to a data input end of the LRAM64 according to different configuration modes.

For example, when the configuration mode is the LRAM64×1 mode, the multiplexer mux3to1 is used for outputting the input data to the data input port;

when the configuration mode is the LRAM32×2 mode, the multiplexer mux3to1 is used for outputting input data of a low LRAM32 in two LRAM32 to the data input port;

when the configuration mode is the SR32×1 mode, the multiplexer mux3to1 is used for outputting shift output data output by a shift data output port of an upper-level SR32 to the data input port; and when the configuration mode is the SR16×2 mode, the multiplexer mux3to1 is used for outputting, to the data input port, shift output data output by a shift data output port of a low SR16 in two upper-level SR16.

In a specific example, the configuration mode may be determined according to a three-digit binary value. If an initial value is set to 000, it is specified that the configuration mode corresponding to 000 is the LUT6 mode, the configuration mode corresponding to 001 is the LUT5_2 mode, the configuration mode corresponding to 010 is the LRAM64×1 mode, the configuration mode corresponding to 011 is the LRAM32×2 mode, the configuration mode corresponding to 100 is the SR32×1 mode, and the configuration mode corresponding to 101 is the SR32×2 mode.

Figure 3:
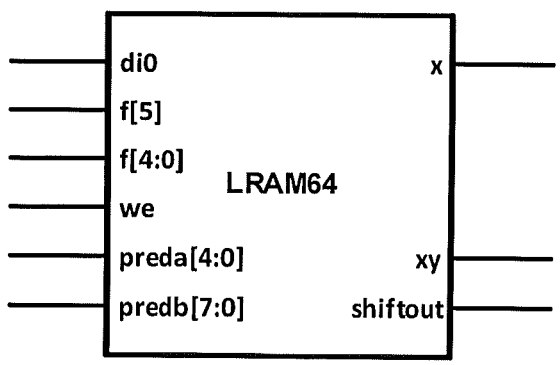
FIG. 3 is a schematic diagram of ports of an LRAM64 according to an embodiment of the present invention.

The LRAM64 includes multiple input/output ports, as shown in FIG. 3.

Different functions corresponding to different modes may be specifically shown in Table 2 below:

TABLE 2

| Port category | Port | Type | Data width | Description |
|---|---|---|---|---|
| Data input port | di0 | input | 1 | Input data in the LRAM64 mode. If configuration is the LRAM32 mode, di0 is low input data. If configuration is the SR32 mode, di0 is shift input data. If configuration is the SR16 mode, di0 is low shift input data. |
| Read address input port | f[5] | input | 1 | The highest bit of a read address in the LRAM64 mode. If configuration is the LRAM32 mode, f[5] is high input data. If configuration is the SR16 mode, f[5] is high shift input data. If configuration is the LUT6 mode, f[5] is f[5] input. |
|  | f[4:0] | input | 5 | A low 5-bit read address in the LRAM64 mode. If configuration is the LRAM32 mode, f[4:0] is an input read address. If configuration is the SR mode, f[4:0] is a dynamic read address. If configuration is the LUT6 mode, f[4:0] is f[4:0] input. If configuration is the LUT5_2 mode, f[4:0] is f[4:0] input. |

TABLE 2-continued

| Port category | Port | Type | Data width | Description |
|---|---|---|---|---|
| Enable signal input port | we | input | 1 | A write enable signal in the LRAM mode. If configuration is the SR mode, we is a shift enable signal. |
| Write address input port | preda[4:0] | input | 5 | Low write address decoding input in the LRAM mode |
| | predb[7:0] | input | 8 | High write address decoding input in the LRAM mode |
| First output port | x | output | 1 | High output data in the LRAM32 mode. If configuration is the SR16 mode, x is high output data. If configuration is the LUT5_2 mode, x is output of an upper LUT5. |
| Second output port | xy | output | 1 | Output data in the LRAM64 mode. If configuration is the LRAM32 mode, xy is low output data. If configuration is the SR32 mode, xy is output data. If configuration is the SR16 mode, xy is low output data. If configuration is the LUT6 mode, xy is xy output. If configuration is the LUT5_2 mode, xy is output of a low LUT5. |
| Shift data output port | shiftout | output | 1 | Shift data output |

Input and output of the FPGA storage structure in different modes are further described below.

When the configuration mode is the LRAM64×1 mode, the data input port is used for receiving the input data; the read address input port is used for receiving a 6-bit read address signal; the write address input port includes a 5-bit low write address decoding input port and an 8-bit high write address decoding input port, separately used for receiving corresponding write address decoding signals; the enable signal input port is used for receiving a write enable signal; and the second output port is used for outputting the output data.

When the configuration mode is the LRAM32×2 mode, the data input port is used for receiving input data of a low LRAM32 in two LRAM32; in the read address input port, the highest bit is used for receiving input data of a high LRAM32 in the two LRAM32, and the other 5 bits are used for receiving a 5-bit read address signal; the write address input port includes a 5-bit low write address decoding input port and an 8-bit high write address decoding input port, separately used for receiving corresponding write address decoding signals; the enable signal input port is used for receiving a write enable signal; the first output port is used for outputting output data of the high LRAM32 in the two LRAM32; and the second output port is used for outputting output data of the low LRAM32 in the two LRAM32.

When the configuration mode is the SR32×1 mode, the data input port is used for receiving shift input data; in the read address input port, 5 bits except the highest bit are used for receiving a dynamic read address signal; the enable signal input port is used for receiving a shift enable signal; the second output port is used for outputting the output data; and the shift data output port is used for outputting shift output data.

When the configuration mode is the SR16×2 mode, the data input port is used for receiving shift input data of a low SR16 in two SR16; in the read address input port, the highest bit is used for receiving shift input data of a high SR16 in the two SR16, and 5 bits except the highest bit are used for receiving a dynamic read address signal; the enable signal input port is used for receiving a shift enable signal; the first output port is used for outputting output data of the high SR16 in the two SR16; the second output port is used for outputting output data of the low SR16 in the two SR16; and the shift data output port is used for outputting shift output data.

When the configuration mode is the LUT6 mode, the read address input port is used for receiving a 6-bit input signal; and the second output port is used for outputting output data of the LUT6.

When the configuration mode is the LUT5×2 mode, in the read address input port, 5 bits except the highest bit are used for receiving a 5-bit input signal; the first output port is used for outputting output data of the first LUT5 in two LUT5; and the second output port is used for outputting output data of the second LUT5 in the two LUT5.

In addition, as shown in FIG. 1, the storage structure provided in the embodiment of the present invention further includes: an output selection unit; and in this embodiment, seven 2-to-1 multiplexers are specifically included.

For ease of description, it is specified that the four LRAM64 from bottom to top in FIG. 1 are separately a first local memory, a second local memory, a third local memory and a fourth local memory.

An input end of a first 2-to-1 multiplexer (mux1) is separately connected to a second output port of the fourth local memory and a second output port of the third local memory;

an input end of a second 2-to-1 multiplexer (mux2) is separately connected to a second output port of the second local memory and a second output port of the first local memory;

an input end of a third 2-to-1 multiplexer (mux3) is separately connected to output ends of the mux1 and the mux2;

an input end of a fourth 2-to-1 multiplexer (mux4) is separately connected to a first output port of the fourth local memory and the output end of the mux1, and multiplexes and outputs a fourth multiplexing output signal of the storage structure;

an input end of a fifth 2-to-1 multiplexer (mux5) is separately connected to a first output port of the second local memory and the output end of the mux2, and multiplexes and outputs a third multiplexing output signal of the storage structure;

an input end of a sixth 2-to-1 multiplexer (mux6) is separately connected to a first output port of the third local memory and an output end of the mux3, and multiplexes and outputs a second multiplexing output signal of the storage structure; and an input end of a seventh 2-to-1 multiplexer (mux7) is separately connected to a first output port of the first local memory and a shift data output port of the first local memory, and multiplexes and outputs a first multiplexing output signal of the storage structure.

In a specific example, when the first local memory and the second local memory are configured as the LUT6 mode, the first local memory and the second local memory may be separately used for achieving 4-to-1 logic output; 5-to-1 logic output may be further achieved by using the mux2, and 6-to-1 logic output may be further achieved by using the mux3. Accordingly, configurability and flexibility of the FPGA storage structure are enhanced.

An FPGA storage structure provided in the embodiment of the present invention may specifically be a programmable logic block (PLB).

Therefore, based on the case of the example where the FPGA storage structure includes four LRAM64, in such a PLB, applications of any memory and shift register shown in Table 3 below can be supported.

TABLE 3

| Local memory | Shift register |
| --- | --- |
| LRAM32 × 2SP | SR32 × 1 |
| LRAM32 × 2QP | SR16 × 2 |
| LRAM32M | SR64 × 1 |
| LRAM64 × 1SP | SR128 × 1 |
| LRAM64 × 1DP | |
| LRAM64 × 1QP | |
| LRAM64M | |
| LRAM128 × 1SP | |
| LRAM128 × 1DP | |
| LRAM128 × 2SP | |
| LRAM256 × 1SP | |

In addition, it can be seen according to the foregoing description and in combination with FIG. 1 that, in the extensible configurable FPGA storage structure provided in the embodiment of the present invention, increase of the mux3to1 at the data input end makes the local storage units all use a repeated structure, which therefore simplifies the design and also decreases process steps and a cycle of FPGA manufacturing; moreover, inside the storage unit, the highest bit of a read address and the highest bit of input data are processed as sharing the same signal input port, so as to reduce the demands for interconnected resources in a case in which functions are unchanged. A storage structure in the embodiment of the present invention can achieve storage of 256-bit data, and based on the structure, during implementation of the design of medium-capacity memories, additional consumption of logic resources can be avoided, and a waste of storage resources brought by use of block memories can also be avoided.

Correspondingly, an embodiment of the present invention further provides an FPGA device, including the extensible configurable FPGA storage structure provided in the foregoing embodiment.

A person skilled in the art may further be aware that, in combination with the examples described in the embodiments disclosed in this specification, units and algorithm steps can be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

Steps of the method or algorithm described in combination with the embodiments disclosed in this specification may be implemented by hardware, a processor-executing software module, or a combination thereof. The software module may be placed in a random access memory (RAM), a memory, a read-only memory (ROM), an electrically programmable ROM, an electrically erasable programmable ROM, a register, a hard disk drive, a removable disk, a CD-ROM, or a storage medium in any other form well-known in the technical field.

The objectives, technical solutions, and beneficial effects of the present invention have been described in further detail in the above specific embodiments. It should be understood that the above descriptions are merely specific embodiments of the present invention, but are not intended to limit the protection scope of the present invention. Any modification, equivalent replacement, or improvement made within the spirit and principle of the present invention should fall within the protection scope of the present invention.

What is claimed is:

1. An extensible configurable FPGA storage structure, wherein the storage structure comprises: a plurality of local storage units, a controller and two clock buffers, wherein
the two clock buffers are separately used for providing different clock signals for two clock input ports of the controller;
the controller is used for receiving a write address signal input externally, and driven by the clock signals, generating a plurality of enable signals and write address decoding signals to be output to the plurality of local storage units; and
each of the local storage units comprises a local memory and a multiplexer used for providing input data for the local memory; and, based on a configuration mode of each local storage unit, generates output data in the corresponding configuration mode according to the enable signals, input write address decoding signals or read address signals, and the input data.

2. The FPGA storage structure according to claim 1, wherein the local memory comprises:
a data input port, a read address input port, a write address input port, an enable signal input port, a first output port, a second output port, and a shift data output port.

3. The FPGA storage structure according to claim 2, wherein the configuration mode comprises:
a six-input lookup table LUT6 mode, a double five-input lookup table LUT5_2 mode, a 64-bit local memory LRAM64×1 mode, a double 32-bit local memory LRAM32×2 mode, a 32-bit shift register SR32×1 mode, and a double 16-bit shift register SR16×2 mode.

4. The FPGA storage structure according to claim 3, wherein the multiplexer is specifically a 3-to-1 multiplexer, wherein
when the configuration mode is the LRAM64×1 mode, the multiplexer is used for outputting the input data to the data input port;

when the configuration mode is the LRAM32×2 mode, the multiplexer is used for outputting input data of a low LRAM32 in two LRAM32 to the data input port;

when the configuration mode is the SR32×1 mode, the multiplexer is used for outputting shift output data output by a shift data output port of an upper-level SR32 to the data input port; and when the configuration mode is the SR16×2 mode, the multiplexer is used for outputting, to the data input port, shift output data output by a shift data output port of a low SR16 in two upper-level SR16.

5. The FPGA storage structure according to claim 3, wherein, when the configuration mode is the LRAM64×1 mode, the data input port is used for receiving the input data;
the read address input port is used for receiving a 6-bit read address signal;
the write address input port comprises a 5-bit low write address decoding input port and an 8-bit high write address decoding input port, separately used for receiving corresponding write address decoding signals;
the enable signal input port is used for receiving a write enable signal; and
the second output port is used for outputting the output data.

6. The FPGA storage structure according to claim 3, wherein, when the configuration mode is the LRAM32×2 mode, the data input port is used for receiving input data of a low LRAM32 in two LRAM32;
in the read address input port, the highest bit is used for receiving input data of a high LRAM32 in the two LRAM32, and the other 5 bits are used for receiving a 5-bit read address signal;
the write address input port comprises a 5-bit low write address decoding input port and an 8-bit high write address decoding input port, separately used for receiving corresponding write address decoding signals;
the enable signal input port is used for receiving a write enable signal;
the first output port is used for outputting output data of the high LRAM32 in the two LRAM32; and
the second output port is used for outputting output data of the low LRAM32 in the two LRAM32.

7. The FPGA storage structure according to claim 3, wherein, when the configuration mode is the SR32×1 mode, the data input port is used for receiving shift input data;
in the read address input port, 5 bits except the highest bit are used for receiving a dynamic read address signal;
the enable signal input port is used for receiving a shift enable signal;
the second output port is used for outputting the output data; and
the shift data output port is used for outputting shift output data.

8. The FPGA storage structure according to claim 3, wherein, when the configuration mode is the SR16×2 mode, the data input port is used for receiving shift input data of a low SR16 in two SR16 ;
in the read address input port, the highest bit is used for receiving shift input data of a high SR16 in the two SR16 , and 5 bits except the highest bit are used for receiving a dynamic read address signal;
the enable signal input port is used for receiving a shift enable signal;
the first output port is used for outputting output data of the high SR16 in the two SR16 ;
the second output port is used for outputting output data of the low SR16 in the two SR16 ; and
the shift data output port is used for outputting shift output data.

9. The FPGA storage structure according to claim 3, wherein, when the configuration mode is the LUT6 mode, the read address input port is used for receiving a 6-bit input signal; and
the second output port is used for outputting output data of the LUT6.

10. The FPGA storage structure according to claim 3, wherein, when the configuration mode is the LUT5×2 mode, in the read address input port, 5 bits except the highest bit are used for receiving a 5-bit input signal;
the first output port is used for outputting output data of the first LUT5 in two LUT5; and
the second output port is used for outputting output data of the second LUT5 in the two LUT5.

11. The FPGA storage structure according to claim 1, wherein the controller comprises:

a first clock input port, a second clock input port, a low 6-bit write address input port, a $7^{th}$ bit write address input port, a $8^{th}$ bit write address input port, four write enable signal output ports, a first write address decoding signal output port and a second write address decoding signal output port, wherein in a 6-bit address signal input by the low 6-bit write address input port, 3 bits are decoded to obtain an 8-bit second write address decoding signal; two bits in the other 3 bits are decoded to obtain first 4 bits in a 5-bit first write address decoding signal; and the last bit in the other 3 bits directly serves as the last bit in the first write address decoding signal; and the number of the plurality of local storage units is specifically 4, and the four write enable signal output ports separately output enable signals to the 4 local storage units.

12. The FPGA storage structure according to claim 3, wherein the storage structure further comprises: an output selection unit, wherein the output selection unit comprises: seven 2-to-1 multiplexers, wherein an input end of a first 2-to-1 multiplexer is separately connected to a second output port of a fourth local memory and a second output port of a third local memory;

an input end of a second 2-to-1 multiplexer is separately connected to a second output port of a second local memory and a second output port of a first local memory;

an input end of a third 2-to-1 multiplexer is separately connected to output ends of the first 2-to-1 multiplexer and the second 2-to-1 multiplexer;

an input end of a fourth 2-to-1 multiplexer is separately connected to a first output port of the fourth local memory and the output end of the first 2-to-1 multiplexer, and multiplexes and outputs a fourth multiplexing output signal of the storage structure;

an input end of a fifth 2-to-1 multiplexer is separately connected to a first output port of the second local memory and the output end of the second 2-to-1multiplexer, and multiplexes and outputs a third multiplexing output signal of the storage structure;

an input end of a sixth 2-to-1 multiplexer is separately connected to a first output port of the third local memory and an output end of the third 2-to-1 multiplexer, and multiplexes and outputs a second multiplexing output signal of the storage structure; and an input end of a seventh 2-to-1 multiplexer is separately connected to a first output port of the first local memory and a shift data output port of the first local memory, and multiplexes and outputs a first multiplexing output signal of the storage structure.

13. An FPGA device, wherein the FPGA device comprises the extensible configurable FPGA storage structure according to claim 1.

* * * * *